(12) United States Patent
Namdar-Mehdiabadi et al.

(10) Patent No.: US 8,456,206 B2
(45) Date of Patent: Jun. 4, 2013

(54) PHASE-LOCKED LOOP LOCK DETECT

(75) Inventors: Ardeshir Namdar-Mehdiabadi, Ottawa (CA); Yong Hee Lee, Tustin, CA (US); Thomas Obkircher, Tustin, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/164,098

(22) Filed: Jun. 20, 2011

(65) Prior Publication Data

US 2012/0319747 A1 Dec. 20, 2012

(51) Int. Cl.
*H03L 7/06* (2006.01)
(52) U.S. Cl.
USPC .......................... 327/156; 327/147
(58) Field of Classification Search
USPC .................... 327/147, 149, 156, 158
See application file for complete search history.

(56) References Cited

U.S. PATENT DOCUMENTS

| | | | |
|---|---|---|---|
| 4,516,083 A | 5/1985 | Turney | |
| 4,870,684 A | 9/1989 | Arai et al. | |
| 5,278,520 A * | 1/1994 | Parker et al. | 331/1 A |
| 5,394,444 A | 2/1995 | Silvey et al. | |
| 5,986,485 A * | 11/1999 | O'Sullivan | 327/156 |
| 7,449,928 B2 * | 11/2008 | Kobayashi | 327/156 |
| 7,508,245 B2 * | 3/2009 | Kim et al. | 327/158 |
| 7,676,014 B2 * | 3/2010 | Chen et al. | 375/376 |
| 7,999,584 B2 * | 8/2011 | Rhee et al. | 327/156 |
| 8,169,242 B2 * | 5/2012 | Abbasi et al. | 327/156 |
| 2006/0164138 A1 * | 7/2006 | Kakuta | 327/156 |
| 2006/0226914 A1 * | 10/2006 | Saado | 331/1 A |
| 2006/0280276 A1 * | 12/2006 | Chen et al. | 375/376 |
| 2007/0090886 A1 | 4/2007 | Kriz | |
| 2012/0025883 A1 * | 2/2012 | Lin | 327/158 |

OTHER PUBLICATIONS

Hovsepyan, A., et al. Lock Detector with Stable Parameters, *4th International Design and Test Workshop (IDT)*,2009, IEEE, pp. 1-4.
Pedroni, V. A., et al.(2006). PLL-Less Clock Multiplier with Self-Adjusting Phase Symmetry, *International Symposium on Circuits and Systems*, 2006, IEEE, pp. 4655-4658.
International Search Report and Written Opinion of Nov. 14, 2012 for International Application No. PCT/US2012/042530 filed Jun. 14, 2012, 8 pages.

* cited by examiner

*Primary Examiner* — Adam Houston
(74) *Attorney, Agent, or Firm* — Knobbe, Martens, Olson & Bear LLP

(57) ABSTRACT

Apparatus and methods for detecting a lock in a phase-locked loop (PLL) are disclosed. In one aspect, a lock detect component includes a reference multiplier and a lock detect. The reference multiplier can receive a reference signal, a divider signal, and a voltage-controlled oscillator (VCO) output generated by a VCO in a PLL from which the divider signal is generated. The reference multiplier can also generate a multiplied reference signal using the reference signal and the VCO output. The multiplied reference signal can have a frequency that is an integer multiple of a frequency of the reference signal. The lock detect can detect a phase lock of the reference signal and the divider signal based at least in part on comparing a signal generated from a delayed reference signal and a signal generated from a delayed divider signal for a predetermined period of time.

22 Claims, 8 Drawing Sheets

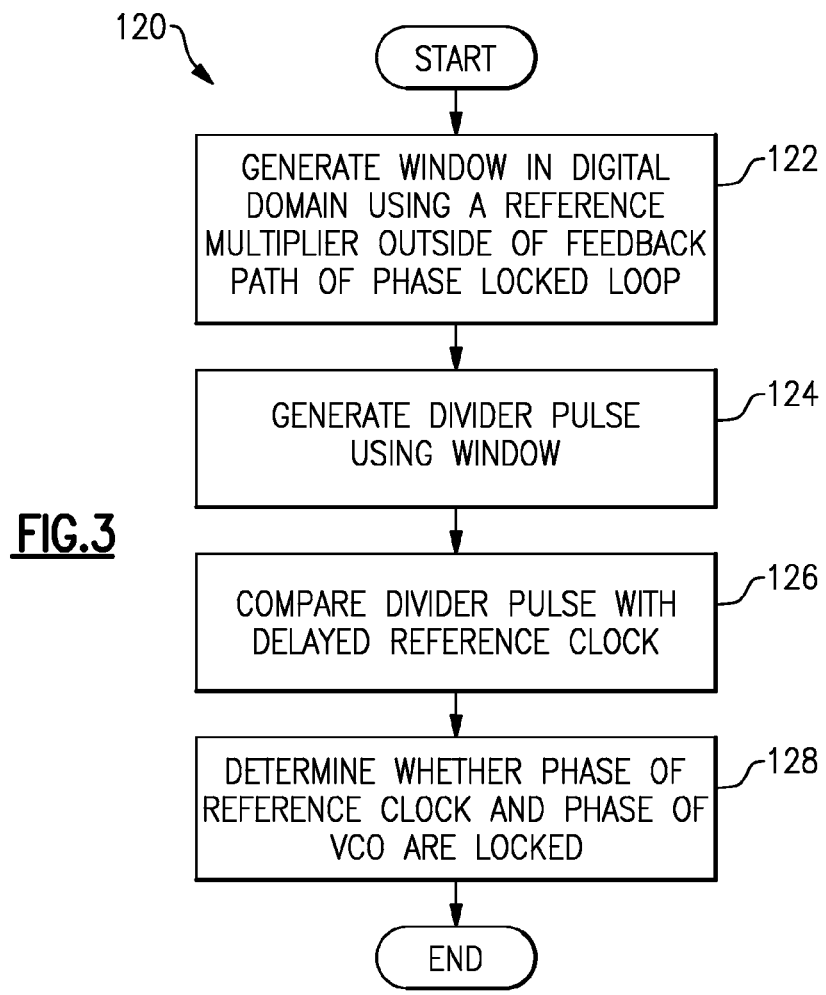
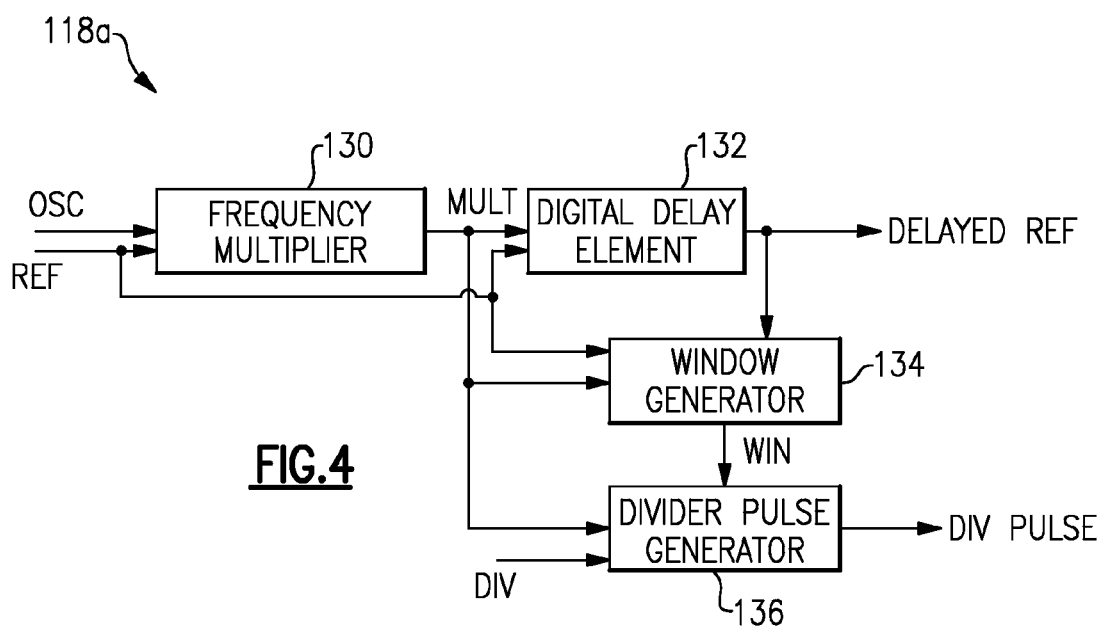

PHASE-LOCKED LOOP LOCK DETECT

BACKGROUND

1. Field

The disclosed technology relates to electronic systems and, in particular, to phase-locked loops.

2. Description of the Related Art

Electronic parts, such as a synthesizer, can include a phase-locked loop (PLL). A PLL can be a closed-loop, frequency-control system based on the phase difference between an input clock signal and a feedback clock signal of a controlled oscillator. The PLL can generate an output signal having a phase related to the phase of an input reference signal. It can be desirable to detect that a PLL is locked in phase and/or frequency. In some instances, once the PLL lock has been detected, a processor can begin receiving and/or transmitting data.

Lock detection in existing PLL systems can be based on outputs of a phase frequency detector that is part of a feedback path of the PLL. This lock detection may be dependent on process, temperature, and/or a frequency at which the PLL is programmed. Any of these dependencies may cause lock detection to fail in a dynamic mode of operation. Alternatively or additionally, existing lock detection systems may detect a lock at a point later in time than the frequency is locked, due to the ways in which a lock is detected. Moreover, some existing lock detection can only predict frequency lock. Accordingly, a need exists for improved lock detection.

SUMMARY OF CERTAIN INVENTIVE ASPECTS

The methods and apparatus described in the claims each have several aspects, no single one of which is solely responsible for its desirable attributes. Without limiting the scope of this invention, some prominent features will now be briefly discussed.

One aspect of this disclosure is a lock detect component. The lock detect includes a reference multiplier and a lock detect in communication with the reference multiplier. The reference multiplier can be configured to receive a reference signal, a divider signal, and a voltage-controlled oscillator (VCO) output generated by a VCO in a phase-locked loop (PLL) from which the divider signal is generated. The reference multiplier can be configured to generate a multiplied reference signal based on the reference signal and the VCO output, the multiplied reference signal having a frequency that is an integer multiple of a frequency of the reference signal, the integer having a value of at least 2. The reference multiplier can also be configured to generate, using digital logic, a delayed reference signal based on the divider signal and the multiplied reference signal. In addition, the reference multiplier can be configured to generate, using digital logic, a delayed divider signal based on the divider signal and the multiplied reference signal. The lock detect can be configured to detect a phase lock of the reference signal and the divider signal based at least in part on comparing a signal generated from a delayed reference signal and a signal generated from a delayed divider signal for a predetermined period of time. The delayed reference signal and the delayed divider signal can be generated, using digital logic, based on the multiplied reference signal.

In some implementations, the reference multiplier can be configured to generate the multiplied reference signal using at least two programmable counters including a first programmable counter configured to count a rising edge of the reference signal, and a second programmable counter configured to count a falling edge of the reference signal.

According to various implementations, the reference multiplier can be further configured to generate, using digital logic, a window signal based at least in part on the delayed reference signal and the reference signal. In some of these implementations, the reference multiplier can be further configured to generate a divider pulse based on the delayed divider signal and the window signal. In accordance with certain implementations, the lock detect can be configured to detect the lock based on a comparison of the divider pulse and the delayed reference signal. According to some of these implementations, the lock detect can be configured to detect the phase lock based on comparing a count of edge of the delayed reference signal and a count of edges of the divider pulse. In certain implementations, the lock detect can be configured to detect the phase lock based on a result of the comparison indicating that the reference signal and the divider signal are locked for a predetermined period of time.

In accordance with a number of implementations, each of the recited functionalities of the lock detect component are implemented using circuits from a digital circuit library.

Another aspect of this disclosure is an electronic system for detecting a phase lock. The system can include a phase-locked loop, a reference multiplier, and a lock detect in communication with the reference multiplier. The phase-locked loop (PLL) can be configured to lock a phase of a reference signal and a feedback signal provided to a phase detector of the PLL. The PLL can include a variable frequency oscillator. The reference multiplier can be configured to: receive a reference signal and a variable frequency oscillator output generated by the variable frequency oscillator of the PLL; and generate a multiplied reference signal based at least in part on the reference signal and the variable frequency oscillator output, the multiplied reference signal having a frequency that is an integer multiple of a frequency of the reference signal, the integer having a value of at least 2. The lock detect can be configured to detect a phase lock of the reference signal and the feedback signal based at least in part on comparing a signal generated from a delayed reference signal and a signal generated from a delayed feedback signal for a predetermined period of time. The delayed reference signal and the delayed feedback signal can be generated, with digital logic, based at least in part on the multiplied reference signal.

In some implementations, the phase-locked loop, the reference multiplier, and the lock detect are embodied on a single integrated circuit.

According to various implementations, the system can further include a processor configured to start generating data in response to an indicator of lock detect generated by the lock detect.

Yet another aspect of the disclosure is a method of detecting a lock of a phase-locked loop. The method can include generating a delayed reference signal based on a reference signal provided to the phase-locked loop and a VCO output having a frequency that depends on a phase-locked loop output frequency. The method can also include generating a delayed divider signal based on a divider signal generated from an output of a VCO in the phase-locked loop and the VCO output phase-locked. In addition, the method can include counting edges of the delayed reference signal using a first counter implemented in digital logic. The method can additionally include counting edges of the delayed divider signal using a second counter implemented in digital logic. Further, the method can include detecting whether a phase of the reference signal and a phase of the divider signal are locked based at least in part on comparing the count of the edges of the delayed reference signal and the count of the edges of the delayed divider signal for a predetermined period of time.

In some implementations, the first counter can be a programmable counter configurable to adjust an accuracy of determining whether the phase of the reference signal and the phase of the divider signal are locked.

According to various implementations, determining whether the phase of the reference signal and the phase of the divider signal are locked can be computed to within 1% accuracy.

In accordance with a number of implementations, comparing the count of the edges of the delayed reference signal and the count of the edges of the delayed divider signal can further include counting edges of an output of a comparator. In accordance with some of these implementations, counting edges of the output of a comparator can be based on a divided reference signal generated by a divider circuit configured to reduce the frequency of the reference signal. According to certain implementations, the predetermined period of time can be adjusted by changing the frequency of the divided reference signal via the divider circuit.

In some implementations, the method can further include generating a window signal based on the reference signal and the delayed reference signal. This window signal can provide a timeframe during which the delayed divider signal can be asserted For purposes of summarizing the disclosure, certain aspects, advantages and novel features of the inventions have been described herein. It is to be understood that not necessarily all such advantages may be achieved in accordance with any particular embodiment. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 3 is a flowchart of an example method of determining a lock detect according to an embodiment.

FIG. 4 is a block diagram of reference multiplier, according to an embodiment.

DETAILED DESCRIPTION OF CERTAIN EMBODIMENTS

Figure 1:
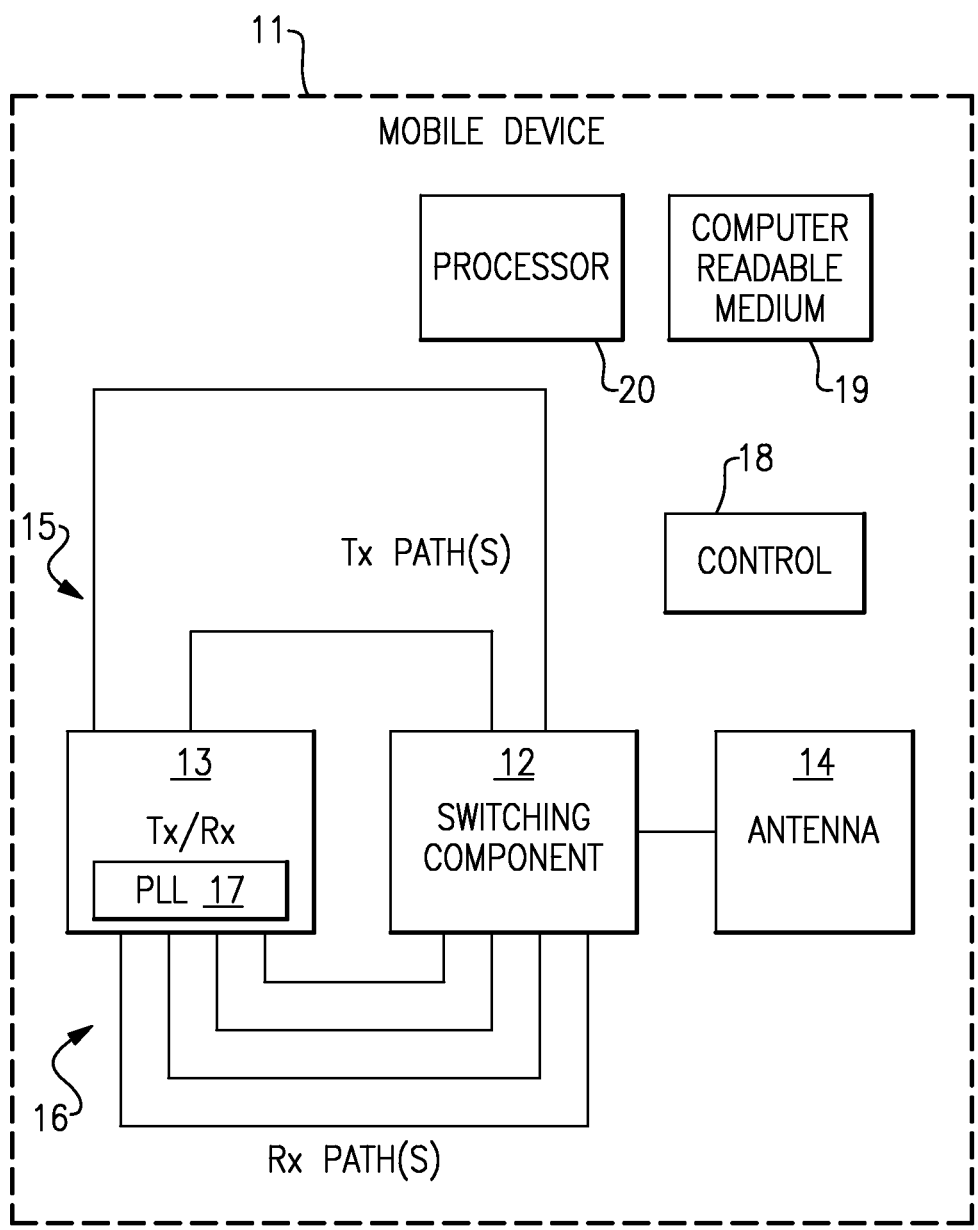
FIG. 1 schematically depicts a mobile device, which can include a phase-locked loop.

Generally described, aspects of the present disclosure relate to a phase-locked loop (PLL) in an electronic system. More specifically, the present disclosure relates to determining whether the PLL is locked in phase and/or frequency. When a PLL of a synthesizer is locked, an indicator of lock detect can be provided to the electronic system. For example, the indicator of lock detect can be used to start a base band processor to generate receive and/or transmission data. Activating such a base band processor when the PLL is not locked can create a number of problems at the system level due to misalignment of clock signals.

Yet conventional lock detection has encountered a number of problems. For example, existing systems can suffer problems due to variations in temperature, a process used to manufacture semiconductor components of the system, and/or a frequency at which a PLL is programmed. As a result, in some instances, lock detection can fail at high operating temperatures and/or in fast processes. Any of these problems may result from using analog delay elements, such as RC delay elements, to detect a frequency lock of a PLL. Moreover, the dynamic operation of an analog PLL can exacerbate these problems and lock detection can fail in a dynamic mode of operation. Furthermore, a number of existing approaches may not be scalable to newer process technologies. Alternatively or additionally, conventional lock detection schemes may detect a lock in frequency, but not a phase lock. This can also cause a delay in providing an indicator of a lock detect to a synthesizer, which may result in an electronic system waiting idle for a period of time during which the PLL is locked.

The methods and apparatus for lock detection described herein can address one or more of these problems, among others. For instance, lock detection as described herein can solve problems related to variations in temperature and/or process. Alternatively or additionally, the methods and apparatus for lock detection described herein can predict a phase lock of a system.

Lock detection can use a delay element to determine if a signal is locked with another signal. By making the delay deterministic, such a delay can be independent of process and temperature. In digital circuits, a delay of a lower frequency signal can be produced by a higher frequency clock signal. Lock detection circuits can compare a reference signal (which can also be referred to as a "reference clock") and a divider signal of a PLL (which can also be referred to as a "divider clock"). A signal with a higher frequency than the reference signal and the divider signal can be used to produce a window during which the reference signal and the divider signal can be compared.

A reference multiplier can be used to create the higher frequency signal. In some conventional designs, an output of an independent oscillator in the PLL can be used to implement a reference multiplier that generates the higher frequency signal. Using the output of the VCO in the PLL can eliminate a need for additional circuitry to implement a reference multiplier, which can, among other things, save die area. Although the feedback path of the PLL has conventionally used to create a reference multiplier, a reference multiplier can be implemented outside the feedback path of the PLL and/or independent of the PLL. For instance, an independent oscillator, such as a ring oscillator can create a high frequency signal. The high frequency signal and the reference signal can be used to generate a multiplied reference signal having an integer multiple of the reference signal, for example, using one or more counters. This can create a multiplied reference signal with a frequency that does not depend on a phase lock and/or a feedback path of the PLL. Alternatively or additionally, when the reference multiplier multiplies the frequency of a reference clock based on an output of the VCO in the PLL and a window signal is generated based on the divided VCO output of the PLL provided to a phase frequency detector of the PLL and the multiplied reference clock, a window during which signals are compared to determine a lock detect can be dynamically changed such that phase lock can be accurately detected.

The multiplied reference signal can be used to add a deterministic delay to the reference signal and the divider signal. The delay can be deterministic as the frequency of a VCO in an analog PLL dynamically changes. These delayed signals, or signals generated therefrom, can be compared using an algorithm that can include counting the edges of the delayed signals and comparing the number of edges counted over a predetermined period of time. A lock can be detected when the count of edges of the delayed signals match for one or more consecutive cycles of the predetermined period of time.

With the multiplied reference signal and this lock detect algorithm, one or more of the following advantages can be realized, among others. A window during which a delayed reference signal and a delayed divider signal can be compared can be produced in the digital domain. As a result, the window may be independent of process and temperature. Using digital logic, the design can be scalable to new process technologies and/or implemented using circuits from a standard digital library. This can reduce effort to implement the lock detect algorithm in new process technologies and/or reduce risks of the lock detect algorithm failing in new process technologies. By comparing delayed versions of the divider signal and the reference signal instead of outputs of a phase frequency detector of a PLL, a phase lock can be detected in addition to a lock in frequency. Accordingly, a robust, reliable lock detect indicator can be produced.

The lock detection systems and methods described herein can be implemented in a number of electronic devices, for example, a mobile device. Although lock detect may be described in the context of mobile devices for illustrative purposes, any combination of the features of lock detection described herein can be implemented in any electronic device with a PLL.

FIG. 1 schematically depicts a mobile device 11. Examples of the mobile device 11 include, but are not limited to, a cellular phone (for example, a smart phone), a laptop, a tablet computer, a personal digital assistant (PDA), an electronic book reader, and a portable digital media player. For instance, the mobile device 11 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

The mobile device 11 can include a transceiver component 13 configured to generate RF signals for transmission via an antenna 14, and receive incoming RF signals from the antenna 14. The transceiver 13 can also include one or more phase-locked loops (PLLs) 17 in a receive and/or a transmission path. Each PLL 17 can each include one or more VCOs configured to generate output signals within a frequency band. The PLL 17 can be used, for example, in upconverting a signal in a transmit path and/or downconverting a signal in receive path. Although the example PLL 17 is illustrated in the context of a transceiver 13, any component of a PLL described herein can be implemented in a receiver, transmitter, and/or other electronic systems with a need for a PLL.

One or more output signals from the transceiver 13 can be provided to the switching component 12 using one or more transmission paths 15, which can be output paths associated with different bands and/or different power outputs, such as amplifications associated with different power output configurations (for example, low power output and high power output) and/or amplifications associated with different bands.

Additionally, the transceiver 13 can receive signal from the switching component 12 using one or more receiving paths 16.

The switching component 12 can provide a number of switching functionalities associated with an operation of the wireless device 11, including, for example, switching between different bands, switching between different power modes, switching between transmission and receiving modes, or some combination thereof. However, in certain implementations, the switching component 12 can be omitted. For example, the mobile device 11 can include a separate antenna for each transmission and/or receiving path.

In certain embodiments, a control component 18 can be included and configured to provide various control functionalities associated with operations of the switching component 12, power amplifiers (not illustrated), and/or other operating component(s). Additionally, the mobile device 11 can include a processor 20 for facilitating implementation of various processes. The processor 20 can be configured to operate using instructions stored on a non-transitory computer-readable medium 19. The processor 20 can implement any combination of features of the transceiver 13. The processor 20 can be implemented, for example, as one or more arrangements of logic elements, such as microprocessors, embedded controllers, IP cores, or any combination thereof. The processor 20 can be implemented out of any combination of analog and/or digital circuit elements.

Figure 2A:
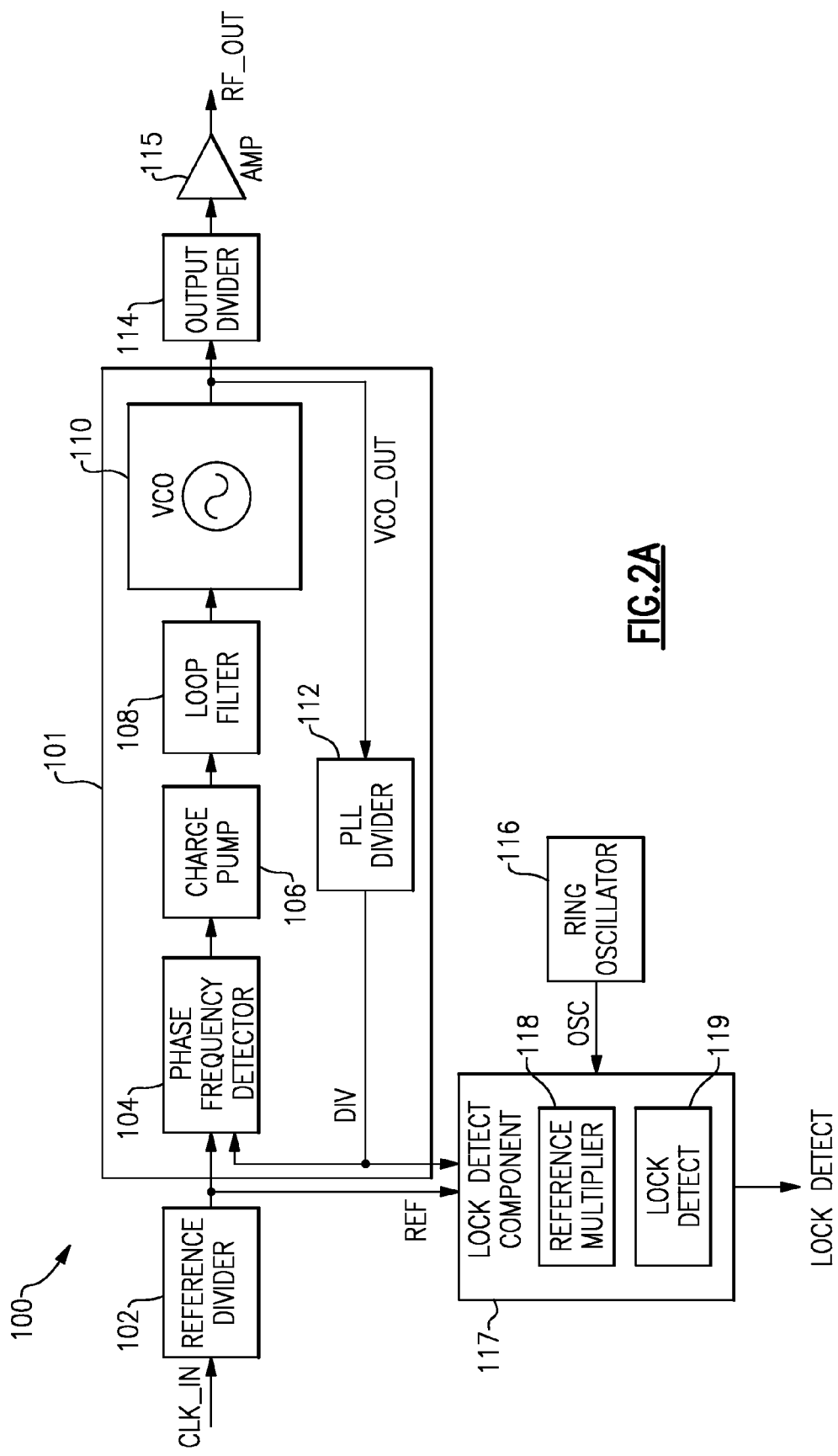
FIG. 2A schematically illustrates an electronic system that includes a phase-locked loop, according to an embodiment.
Figure 2B:
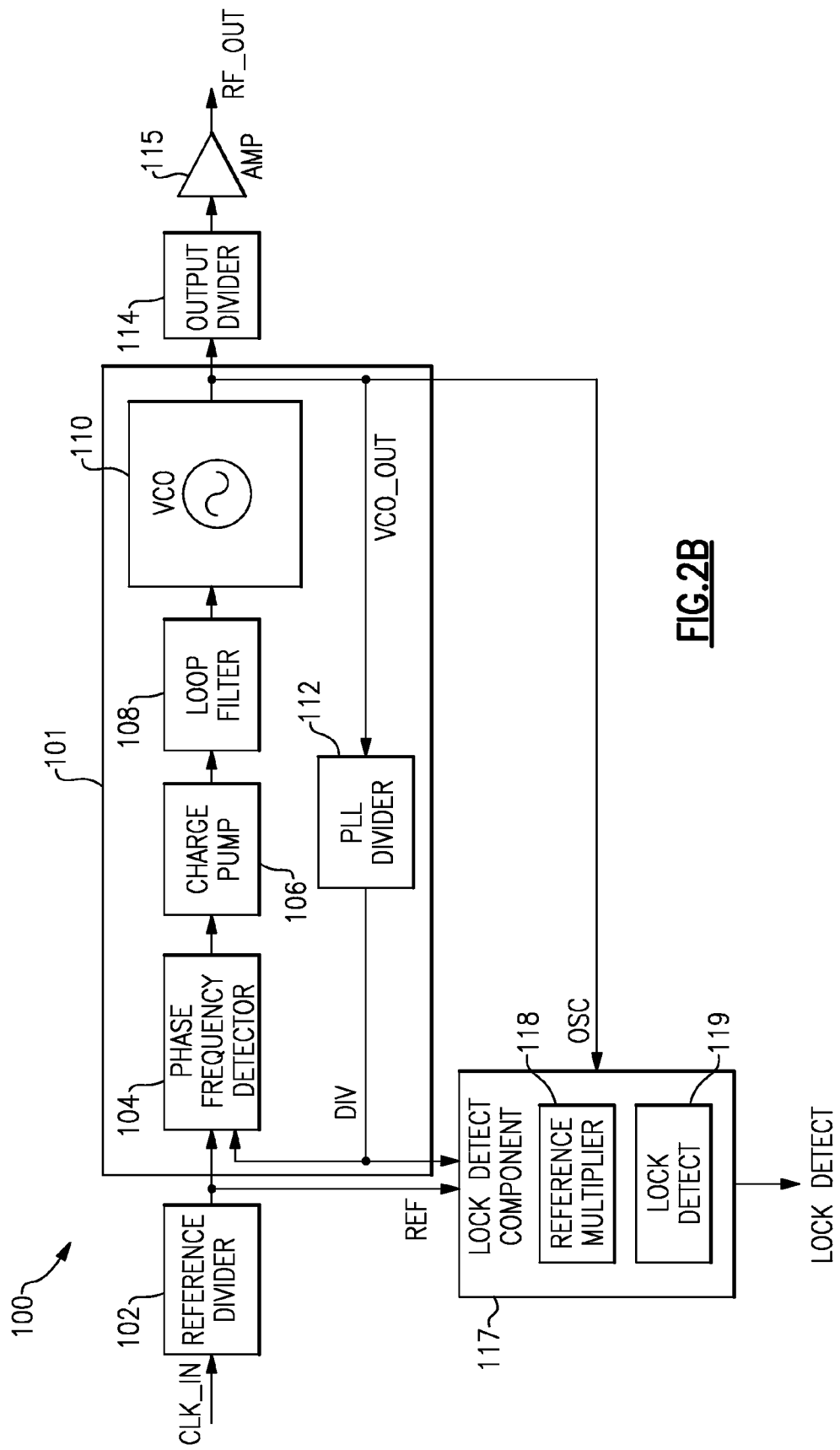
FIG. 2B schematically illustrates an electronic system that includes a phase-locked loop, according to another embodiment.

FIGS. 2A and 2B schematically illustrate examples of an electronic system 100 that includes a PLL 101. The PLL 101 is an example implementation of the PLL 17 of FIG. 1. The system 100 can be implemented using analog and/or digital electronic circuits. Moreover, the system 100 can be implemented on one or more integrated circuits. As illustrated, the system 100 includes a reference divider 102, a phase frequency detector 104, a charge pump 106, a loop filter 108, a VCO 110, a PLL divider 112, an output divider 114, and an output amplifier 115. The illustrated PLL 101 includes the phase frequency detector 104, the charge pump 106, the loop filter 108, the VCO 110, and the PLL divider 112. In some implementations, such as shown in FIG. 2A, the system 100 can also include a ring oscillator 116 outside of the PLL 101. In other implementations, such as shown in FIG. 2B, the system 100 does not include a ring oscillator outside of the PLL 101 for purposes of detecting a lock of the PLL 101. The electronic system 100 can also include a lock detect component 117. The lock detect component 117 can include a reference multiplier 118 and a lock detect 119.

The reference divider 102 can receive an input clock CLK_IN and generate a reference clock signal REF having a frequency of the input clock divided by N. However, the reference divider 102 may not be included in some implementations, and the reference clock signal REF can be an input to the electronic system 100. The phase frequency detector 104 can receive the reference clock signal REF and align an edge of the reference clock (for example, a rising edge) to the divider clock DIV generated by the PLL divider 112. The PLL divider 112 can generate the divider clock DIV, which may also be referred to as a feedback clock, from the VCO output VCO_OUT. The divider clock DIV can have a frequency of the frequency of VCO divided by M. The phase frequency detector 104 can detect a relative difference in phase and frequency between the reference clock REF and the divider clock DIV.

Based on whether the divider clock frequency is lagging or leading the reference clock frequency, the phase frequency detector 104 can provide control signal(s) to control the charge pump 106 that indicate that the VCO 110 should operate at a higher or a lower frequency. However, when the divider clock and the reference clocks are aligned, the VCO frequency may remain the same. If the charge pump 106 receives an indicator that the frequency of VCO 110 should be increased, current can be driven into the loop filter 108. Conversely, if the charge pump 106 receives an indicator that the frequency of VCO 110 should be decreased, current can be drawn from the loop filter 108.

The loop filter 108 can generate a control voltage based on signals from the charge pump control 106. The control voltage can be used to bias the VCO 110. Based on the control voltage, the VCO 110 can oscillate at a higher or lower frequency, which can affect the phase and frequency of the divider clock DIV. The VCO 110 can stabilize once the reference clock REF and the feedback clock DIV have substantially the same phase and frequency. The loop filter 108 can filter out jitter by removing glitches from the charge pump 106, thereby preventing voltage over-shoot.

In some implementations, the VCO 110 can include a plurality of individual VCOs. For instance, in some implementations, 2 to 8 VCOs may be included in VCO 110. In implementations with a plurality of VCOs, each of the plurality of VCOs can generate an output within a specific frequency band that overlaps with a corresponding frequency band of another VCO. With a plurality of VCOs, one individual VCO of the VCO 110 can be selected to generate the VCO output, based on the desired output frequency. In this way, a wide range of output frequencies can be generated with high-performance within the entire range of VCO output frequencies.

The VCO output VCO_OUT can be provided to the PLL divider 112 and the output divider 114. The output divider 114 can generate an output divider clock having an output divider signal that is less than the VCO output frequency. The output amplifier 115 can receive the output divider clock and provide an amplified output signal.

Additionally, as shown in FIG. 2A, the system 100 can include the ring oscillator 116, which can be implemented outside of the PLL 101. The ring oscillator 116 can be implemented by any suitable oscillator architecture. The output OSC of ring oscillator 116 can be independent of the VCO output of the VCO 110 of the PLL 101. Thus, the VCO output of ring oscillator 116 may not be impacted by changes in the feedback path of the PLL 101.

In some implementations, the system 100 can detect a lock of the PLL 101 without using an oscillator outside of the PLL 101. For example, as shown in FIG. 2B, the output OSC of the VCO 110 can be provided to the lock detect component 117 and be used to generate a multiplied reference clock signal. In this way, a single VCO can be used for detecting a lock of the PLL 101.

The system 100 can also include a lock detect component 117. Any combination of the features of the lock detect component 117 may be implemented on a processor, for example, the processor 20 of FIG. 1. The lock detect component 117 may be implemented on either the same integrated circuit or a separate integrated circuit from the other illustrated components of the electronic system 100. As illustrated, the lock detect component 117 is outside of a feedback path of the PLL 101 and outside of the PLL 101. The lock detect component 117 can detect when the reference clock REF and the divider clock DIV are locked. The lock detect component 117 can include a reference multiplier 118 and a lock detect 119.

The reference multiplier 118 can generate a multiplied reference clock having a frequency that is an integer multiple of the reference clock REF, based on the reference REF and the output of the ring oscillator 116 and/or the output of the VCO 110. The multiplied reference clock can be generated without using signals generated in the feedback path of the PLL 101. In fact, the multiplied reference clock can be generated independent of the PLL 101. The reference multiplier 118 can also generate a delayed reference clock and a delayed divider clock using the multiplied reference clock. More detail regarding example implementations of the reference multiplier 118 will be provided in connection with FIGS. 4-6.

The lock detect 119 can determine whether the reference clock REF and the divider clock DIV are locked. For example, the lock detect 119 can count edges (for example, rising edges and/or falling edges) of the delayed reference clock and the delayed divider clock over a predetermined number of cycles of the multiplied reference clock. When a predetermined number of edges of the delayed reference clock or the delayed divider clock have been counted, the count can be compared to the count of the other delayed clock, for example, using a comparator. A lock can be detected when the comparison indicates that the counts match for a predetermined amount of time, for example, as measured by a number of clock cycles. More details regarding the lock detect 119 will be provided in connection with FIGS. 7-8.

FIG. 3 is a flowchart of an example method 120 of determining a lock detect, according to an embodiment. Any combination of the features of the method 120 or any other methods described herein may be embodied in a non-transitory computer readable medium and stored in non-volatile memory. When executed, the non-transitory computer readable medium may cause some or all of the method 120 to be performed. It will be understood that any of the methods discussed herein may include greater or fewer operations and the operations may be performed in any order, as appropriate.

The method 120 can be implemented using a reference multiplier and a lock detect, for example, as illustrated in the lock detect component 117 of FIGS. 2A and/or 2B. The method 120 can determine whether a reference signal and a divider signal from a PLL are locked in frequency and/or phase, using digital logic outside of the feedback loop of a PLL. Using the method 120, a lock of the PLL can be detected. In some implementations, the method 120 can detect a phase lock based on the output of a VCO in the PLL. As a result, in these implementations, additional oscillators outside of the PLL are not needed to determine the phase lock. For instance, a reference multiplier can multiply a reference clock in frequency based on the VCO output from the VCO in the PLL.

At block 122, a window signal can be generated in the digital domain using a reference multiplier. The reference multiplier can include any combination of features of the reference multipliers described herein, for example, the reference multipliers of FIGS. 2A, 2B, 4, and/or 5. The reference multiplier can generate a multiplied reference signal having a frequency that is an integer multiple of the reference signal using the reference signal and a signal from a VCO separate from the VCO used to generate the PLL output, for example, OSC from FIGS. 2A and/or 2B. The multiplied reference signal can be used to delay the reference signal using digital logic. Using digital logic, the window signal can be generated from the reference signal and the delayed reference signal.

A divider pulse can be generated using the window signal at block 124. The divider pulse can be asserted when a first delayed divider signal is asserted while the window signal is asserted. Accordingly, the divider pulse may also be considered a delayed divider signal. The first delayed divider signal can be generated using the multiplied reference signal and a flip flop, latch, or other state element to delay the divider signal from the PLL. The first divider signal can be generated, for example, using the example reference multipliers illustrated in FIGS. 4-5.

The divider pulse can be compared to a delayed reference clock at block 126. This may include, for example, comparing a count of the number of edge of the delayed reference clock and a count of the number of edges of the divider pulse. Counting edges can be implemented using counters that are clocked based on a VCO output that is independent of a PLL. Based on the number of consecutive comparisons indicating that there is overlap between the delayed reference clock and the divider pulse, a lock can be detected to a desired accuracy. Whether the phase of the reference clock and the phase of VCO are locked can be determined at block 128. These functionalities related to lock detect can be implemented, for example, as described in reference to FIG. 7. When a lock is detected, an indicator of the lock detect can be generated and provided to the electronic system that includes the PLL.

Lock detection may be implemented using two logical components: a reference multiplier and a lock detect. Examples of the reference multiplier will be described with reference to FIGS. 4-6, then examples of the lock detect will be described with reference to FIGS. 7-8. Although the example implementations may include certain features in either a reference multiplier or a lock detect, these features may be implemented in the other component in other implementations.

The reference multipliers described herein can generate a signal with an integer multiple of a frequency of a reference signal, without using a PLL. For instance, a clock signal can be multiplied using a plurality of counters clocked with an output of an oscillator that is separate from the PLL (for example, ring oscillator 116), registers, comparators, and/or other digital logic.

FIG. 4 is a block diagram of an example reference multiplier 118a, according to an embodiment. Using the reference multiplier 118a, a multiplied reference clock can be generated. The multiplied reference clock can be used to add a deterministic delay to the reference clock using digital logic. Such a delay may be independent of a frequency of a PLL output. In addition, the reference clock can be used to generate a window, and the window can be used to generate a divider pulse. The delayed reference clock and the divider pulse can be provided to a lock detect (for example, the lock detect 119 of FIG. 2A, FIG. 2B, and/or FIG. 7) to determine if a reference signal and a divider signal are locked in phase and/or frequency. The reference multiplier 118a can include a frequency multiplier 130, a digital delay element 132, a window generator 134, and a divider pulse generator 136.

The frequency multiplier 130 can generate a multiplied reference signal MULT having a frequency that is an integer multiple of the frequency of a reference signal REF. The multiplied reference signal MULT may have a frequency that is a multiple of a power of two of the frequency of the reference signal REF. The frequency multiplier 130 can include a plurality of digital counters that use different edges of the reference signal REF to count the number of transitions of the reference signal. Using digital logic including state elements that can be clocked based on an output of an oscillator separate from the PLL, the frequency multiplier can generate the multiplied reference signal MULT. Alternatively or additionally, using digital logic including state elements that can be clocked based on an output of a VCO in the PLL, the multiplier can generate the multiplied reference signal MULT.

The digital delay element 132 can generate a delayed reference signal DELAYED REF from the multiplied reference signal MULT and the reference signal REF. The digital delay element 132 can be implemented using one or more state elements, such as a flip-flop, latch, or other clocked circuit capable of holding a state. The one or more state elements can use the multiplied reference clock MULT to create the delay.

The window generator 134 can generate a window WIN during which the divider signal DIV and the reference signal REF can be compared. A reliable window signal WIN can be generated using a logic function of the reference signal and a delayed version of the reference signal. The window generator 134 may, in some instances, delay the delayed reference signal DELAYED REF before generating the window signal WIN with digital logic.

The divider pulse generator 136 can generate a divider pulse DIV PULSE using a divider signal from the PLL (for example, DIV from the PLL 101 of FIGS. 2A and/or 2B). The divider pulse generator 136 can delay the divider signal DIV using digital logic that uses the multiplied reference clock MULT to add the delay. The divider pulse can be generated based on the delayed divider signal and the window signal WIN. The divider pulse DIV PULSE can be asserted when the delayed divider pulse and the window signal WIN are both asserted.

Figure 5:
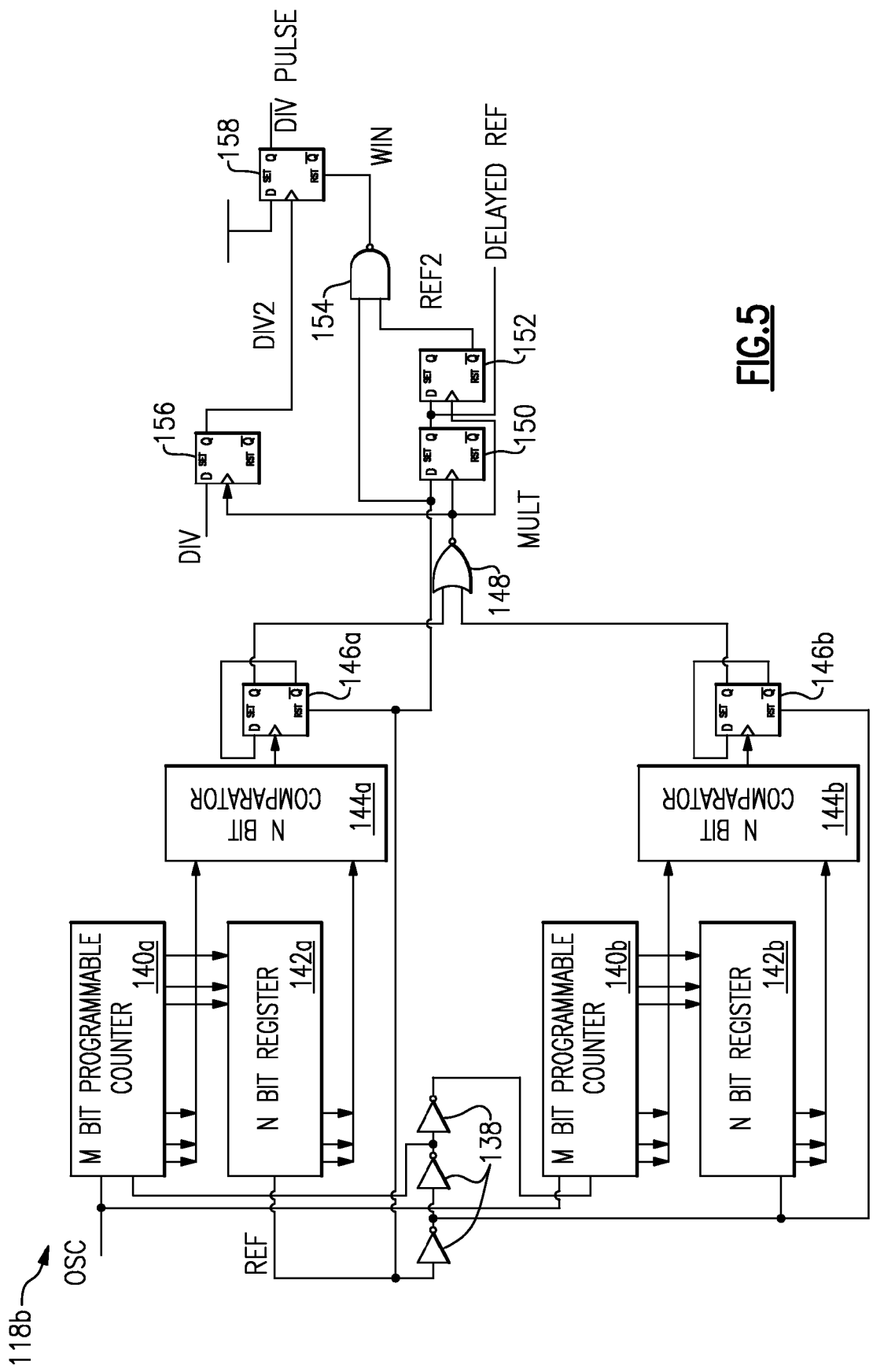
FIG. 5 schematically illustrates another reference multiplier, according to another embodiment.

Referring to FIG. 5, another embodiment of a reference multiplier 118b is provided. Unlike conventional lock detect circuits that include analog delay elements and digital counters, the reference multipliers 118a and/or 118b may not use any analog circuits. In some implementations, all circuits of the reference multipliers 118a and/or 118b can be implemented using standard digital circuit libraries, which can be can be created for any process. The function of circuits in the standard digital library can be independent of the process and easily scaled to new process technologies.

As illustrated in FIG. 5, the reference multiplier 118b includes two similar paths: a rising edge path and a falling edge path. These paths can be implemented with substantially the same circuits having different inputs and different outputs. Digital logic 138 can provide inverted and/or delayed versions of the reference signal REF to registers and/or counters in the reference multiplier 118b. The rising edge path can include an M-bit programmable counter 140a, an N-bit register 142a, an N-bit comparator 144a, and one or more digital state elements 146a (for example, a flip-flop). The falling edge path can include an M-bit programmable counter 140b, an N-bit register 142b, an N-bit comparator 144b, and one or more digital state elements 146b (for example, a flip-flop).

The rising edge path and the falling edge path can each count a number of edges of the reference signal REF based on an output from a ring oscillator independent of the PLL or based on a VCO output of the PLL, such as the VCO 110, as a clock. For illustrative purposes, the rising edge path will be described in more detail. The rising edge path can include a counter, for example, the M-bit programmable counter 140a. For example, M could equal 8, and an 8 bit counter can be used. Such a counter can count from 0 to $2^{M-1}$, which is from 0 to 255 for an 8 bit counter. In this example, the N-bit register 142a can be a 7 bit register, which can be initialized to 127. The value of the N-bit register 142a can be modified over time. When the reference signal is '0', the M-bit counter 140a can start counting. The 7 least significant bits (LSBs) can be compared to the corresponding values stored in the N-bit register 142a. When both outputs are the same, an output of the comparator 146a can be asserted for one pulse of the VCO output OSC. In this example, this can correspond to half of the time that the reference signal is '1'. Yet in other examples, the output of the state element can be high for other fractions of the reference signal (for example, ¼, ⅛, ¹⁄₁₆, etc. . . . ), for example, by adjusting the counter size and/or register values.

As another example, the M-bit counters 140a, 140b can be 17 bit synchronous counters that are programmable. The M-bits counters 140a, 140b can be programmed to an integer value, which can correspond to a particular synthesizer that is being programmed. In this example, the N-bit registers 142a, 142b can be 14 bit registers. The effective size of the N-bit registers can be programmed according to a multiplier value. For instance, for multiplying by 2, N can be 16. Similarly, for multiplying by 4, N can be 15 Bits, for multiplying by 8 N can be 14 bits, and so on. The multiplying value can range from about 2 to $F_{VCO/2}$, where $F_{VCO}$ can represent the frequency of VCO. When the counter 140a or 140b reaches a programmed value, the counter will reset and start counting from zero again.

After the comparator output is asserted for one pulse of OSC, the comparator output can transition back to the unasserted state. The counting can continue until the reference signal goes to '1'. At this point in time, the M most significant bits (MSBs) of the counter 140a can be loaded to register 142a and then the counter 140a can be reset, which can result in the counter 140a stopping. The value of M can depend on a multiplication factor. For example, in a 16 bit counter with a multiplication factor of 2, M can be 15. As another example, in a 16 bit counter with a multiplication factor of 4, M can be 14. In response to the comparator output being asserted to '1', the output of the digital state element 146a can be driven to '1' while the reference signal REF is '0'. When the reference signal REF goes to '1', the output of the digital state element 146a output can be reset to '0'.

An inverted reference signal can be generated by the digital logic 138 from the reference signal REF. The inverted reference signal can be provided to the falling edge path. As a result, the falling edge path can start counting, and output pulse(s) from the digital state element 146b can be produced by the same method as in the rising edge path during the time during which the reference signal REF is '0'.

The outputs from the digital state elements 146a, 146b can be combined by digital logic 148. The digital logic can include, for example, any logic function that can suitably combine the outputs of the digital state elements 146a, 146b to produce the multiplied reference signal MULT, such as a NOR gate. This can generate pulses during both the high and low periods of the reference signal REF. As a result, a multiplied reference signal MULT can be produced with frequency is can be twice the frequency of the reference signal REF. For each additional pulse created from the rising edge and falling edge paths during the same cycle of the reference signal REF, the multiplied reference clock can have a frequency that is twice as high.

The multiplied reference signal MULT can be used to generate a delay on both the divider signal from the PLL and reference signal, for example, using digital state elements, such as flip-flops, latches, or other suitable digital delay elements. As illustrated in FIG. 5, digital delay element 150 (for example, a flip-flop) can be used to delay the reference signal REF using the multiplied reference signal MULT as a clock. The delayed reference signal DELAYED REF can be further delayed and/or inverted, for example using digital delay element 152 (for example, a flip-flop). An output of the digital delay element 152 and the reference signal REF can be used to generate a window signal WIN using digital logic 154. The complement window signal WIN' illustrated in FIG. 5 is the complement or active-low version of the window signal WIN. One of skill in the relevant art will appreciate that any of the signals described herein can be implemented in inverted or active-low form.

A separate delay path can be used to delay the divider signal DIV. For example, digital delay element 156 (for example, a flip-flop) clocked by the multiplied reference signal MULT can create a delayed divider signal DIV2. Creating an artificial delay can account for divider edges that lead or lag reference edges.

A divider pulse generator 158 can detect when an edge of the delayed divider signal DIV2 is within the window represented by the window signal. The divider pulse generator 158 can generate a divider pulse DIV PULSE that is asserted for any portion of a cycle of the delayed divider signal during the window. Otherwise, the divider pulse DIV PULSE will not be asserted. The divider pulse DIV PULSE can be considered a delayed divider signal.

For instance, the divider pulse generator 158 can be implemented using a flip-flop with a data input electrically connected to a power rail, with a reset input electrically connected to the window signal WIN', and the delayed divider signal DIV2 used as a clock signal. The divider pulse DIV PULSE will not be asserted when the PLL is not locked, thereby ensuring that the indicator of lock detect generated by the lock detect will indicate that the PLL is not locked. As soon as the PLL operates in the phase and frequency lock range, the digital counters in the lock detect can show the same value and the indicator of lock detect can indicate that the PLL is locked. The divider pulse DIV PULSE and the delayed reference signal DELAYED REF can be provided to a lock detect, such as the lock detect 119 of FIG. 2A, FIG. 2B, and/or FIG. 7.

Figure 6:
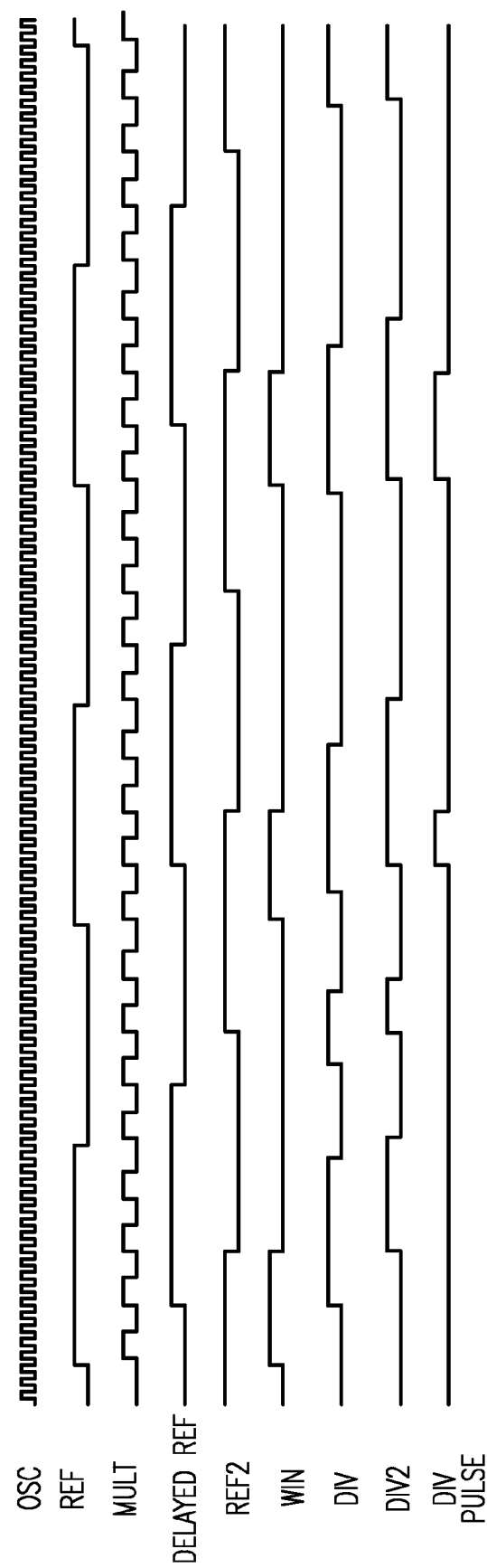
FIG. 6 provides an example timing diagram of the reference multiplier of FIG. 5.

FIG. 6 provides an example timing diagram that illustrates the relationship between signals in the reference multiplier 118b. Using the VCO output OSC and the reference signal REF, a multiplied reference clock MUL can be generated having eight times the frequency of the reference signal REF. The multiplied reference clock MUL can create a delayed reference clock DELAYED REF. As illustrated in FIG. 6, the delayed reference clock DELAYED REF can have a delay of one clock cycle of the multiplied reference clock MUL relative to the reference signal REF. Further the delayed reference signal can be delayed one more signal of the multiplied reference clock MUL relative to the reference clock REF and inverted as the delayed inverted reference clock REF2.

The window signal WIN can represent the overlap between the reference clock and the delayed inverted reference clock REF2. The window signal WIN can represent the logical inverse of the complement window signal WIN' of FIG. 5. In the illustrated example, the window signal WIN can be asserted high for two clock cycles of the multiplied reference clock MUL, then de-asserted low for six cycles of the multiplied reference clock MUL. More generally, the window signal WIN can be asserted based on the reference clock REF being asserted and de-asserted based on the inverted delayed reference clock signal REF2 being de-asserted. Thus, the duty cycle of the window signal WIN can depend on the relative delay between the reference clock REF and the delayed inverted reference clock REF2. The window signal WIN can be a periodic signal having a consistent frequency when the reference clock is a periodic signal having a consistent frequency.

The delayed divider signal DIV2 can represent the divider signal from a PLL delayed by one cycle of the multiplied reference clock MULT. As illustrated in FIG. 6, the divider signal DIV may include pulses that are not of a consistent frequency and/or duty cycle. This can be a result of, for example, the dynamic change in frequency of a VCO of the PLL. The divider pulse DIV PULSE can be asserted in response to a rising edge of the delayed divider signal DIV2 while the window signal WIN is not asserted. The divider pulse DIV PULSE can be de-asserted when the window signal WIN is asserted. More specifically, as illustrated in FIG. 6, the divider pulse DIV PULSE transitions high in response to DIV2 transitioning high only while the window signal WIN is high. Then in response to the window signal WIN transitioning low, the divider pulse DIV PULSE transitions low. Thus, the divider pulse DIV PULSE can represent a delayed version of the divider signal DIV from a PLL that is only asserted during the window.

Any combination of the signals described with reference to FIGS. 4-6 can be provided to a lock detect, such as the lock detect 119 described in connection with FIGS. 2 and/or 7-8, for use in determining if a PLL is locked in phase and/or frequency.

Figure 7:
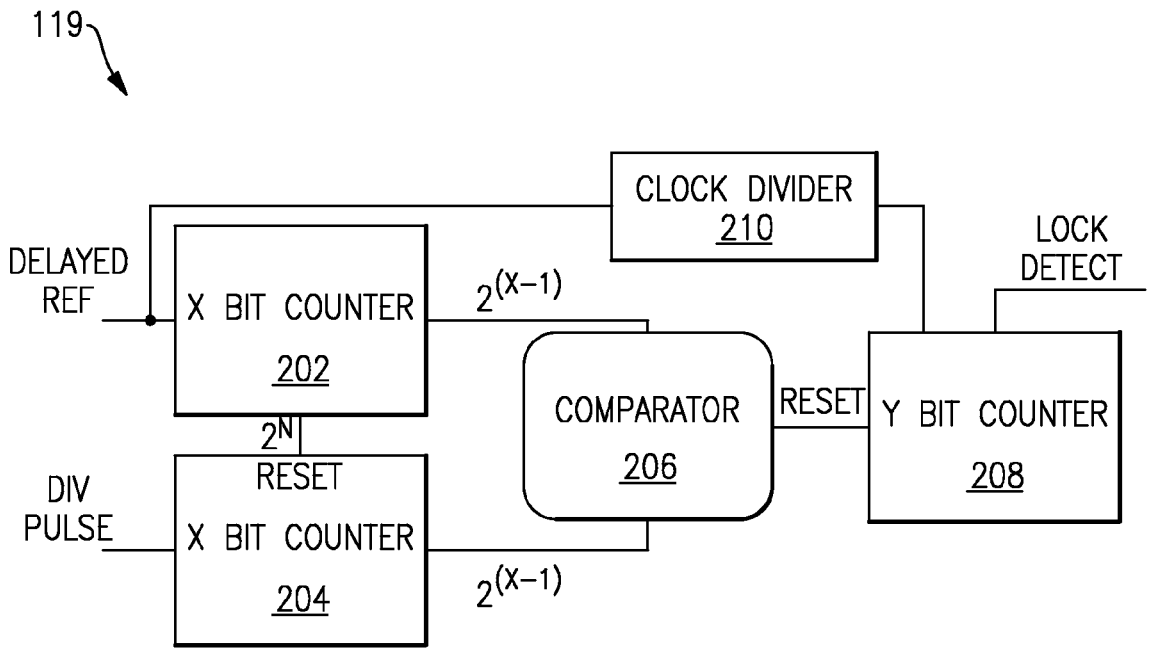
FIG. 7 is a block diagram of lock detector, according to an embodiment.

FIG. 7 is a block diagram of a lock detect 119, according to an embodiment. The lock detect 119 can determine if the reference signal and the divider signal in a PLL (for example, the PLL 101 of FIG. 2A and/or FIG. 2B) are locked in phase and frequency. The lock detect 119 can implement an algorithm that includes counting and comparing the number of edges of a delayed reference signal and a delayed divider signal to detect a lock of a PLL. The lock detect 119 can be implemented in digital logic. Any combination of the illustrated features of the lock detect 119 can be implemented using logic from a standard digital library. The lock detect 119 can receive a delayed reference signal (for example, the delayed reference clock REF from FIG. 4 or FIG. 5) and a delayed divider signal (for example, the divider pulse DIV PULSE from FIG. 4 or FIG. 5). Based on these received signals, the lock detect 119 can generate an indicator of lock detect LOCK DETECT. The lock detect 119 can be included, for example, in the lock detect component 117 of the PLL 101 of FIG. 2A and/or FIG. 2B. The lock detect 119 can include a reference counter 202, a divider counter 204, a comparator 206, a detector timer 208, and a clock divider 210.

The lock detect 119 can include two X bit counters, where X is a positive integer. The X bit counters can be implemented from any digital logic configured to count to $2^X$ edges of a signal. In some implementations, the X bit counters can be programmable such that they can count to various numbers within a counting range. For instance, the X bit counters can be programmed to count within ranges of powers of two, based on the value of X. The two X bit counters can be implemented from the same logical circuit topology, but connected to different inputs and outputs. The first X bit counter can be the reference counter 202 that counts edges of a delayed version of the reference signal, for example, DELAYED REF from FIG. 4 or FIG. 5. The second X bit counter can be the divider counter 204 that counts edges of a delayed version of the divider signal, for example, DIV PULSE from FIG. 4 or FIG. 5. A lock of a PLL can be indicated when the reference counter 202 counts the same number of edges of the delayed reference signal as the number of edges of the delayed divider signal counted by the divider counter 204 at the end of a predetermined cycle time. For instance, when the reference counter 202 counts $2^{X-1}$ edges of the reference signal, the output of divider counter 204 can be compared with the output of the reference counter 202 for one cycle of the reference signal, for example, using comparator 206. This can indicate whether the number of edges of the delayed reference signal and the delayed divider signal are the same during a predetermined cycle time.

When the divider counter 204 has already reached or reaches a count of $2^{X-1}$ during one cycle of the reference signal, the comparator output of the comparator 206 can remain or transition into an active state (for example, a high state in an active high comparator output or a low state in an active low comparator). Otherwise, the comparator output can remain or transition into an inactive state. In other words, the comparator 206 can determine if there is overlap between an output of the reference counter 202 indicating a count of $2^{X-1}$ and an output of the divider counter 204 indicating a count of $2^{X-1}$. When reference counter 202 reaches a count of $2^X$, both the reference counter 202 and the divider counter 204 can be reset.

Figure 8:
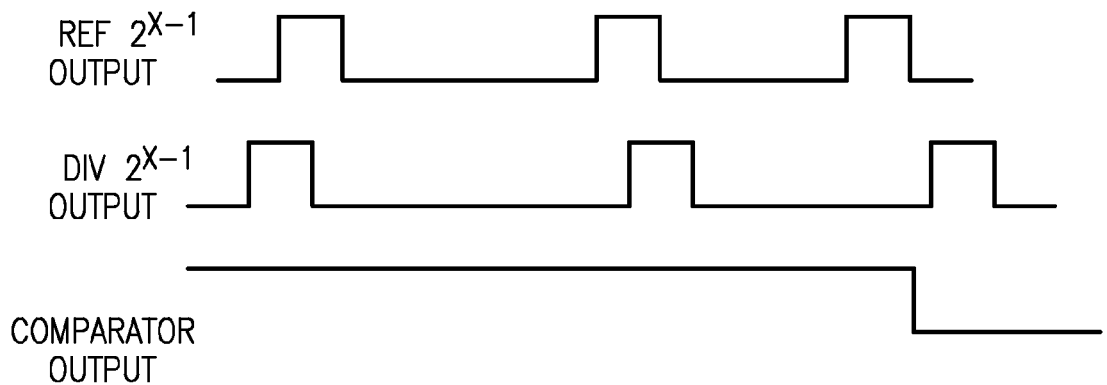
FIG. 8 provides an example timing diagram of the lock detect of FIG. 7.

As shown in FIG. 8, there is overlap for the first two output pulses indicating a count of $2^{X-1}$ for the X bit counters 202, 204. As a result, the comparator output stays high in the active state. However, since there is no overlap between the third set of output pulses indicating a count of $2^{X-1}$, the comparator output transitions low to the inactive state. When the comparator output is asserted, a detector timer 208, which counts Y bits, can continue to count. Alternatively, if the comparator output is not asserted, the detector timer 208 can reset. When the detector timer 208 reaches a predetermined count the detector timer 208 can reach an overflow state that can indicate that the detector timer 208 has counted to the predetermined count without the comparator output resetting the detector timer 208. The overflow state can cause the indicator of lock detect LOCK DETECT to be asserted. In this way, the detector timer 208 can determine an amount of time during which at least a portion of the output pulses indicating a count of $2^{X-1}$ corresponding to the reference signal and the divider signal, respectively, overlap. When these signals overlap for a predetermined number of cycles corresponding to a set period of time, a lock can be detected. The greater the number of consecutive cycles over which there is overlap, the greater the accuracy of the lock detect.

The value of X for the X bit counters 202, 204 can depend on a desired accuracy of a lock detect. For example, to detect a lock with a 1% accuracy, at least 100 cycles of the reference signal can be counted and then outputs of reference counter 202 and the divider counter 204 can be compared to generate the indicator of lock detect LOCK DETECT. To count 100 cycles, a counter of 8 bits or more is needed because a binary counter can count $2^X$ bits and X equals 8 is the smallest integer value of X for which $2^X$ is greater than 100. As another example, to obtain a 0.1% accuracy, 11 bit or greater counters can be used. As yet another example, to obtain a 0.01% accuracy, 15 bit or greater counters can be used. For a lock detect to have between an accuracy ranging from 0.01% to 1%, a 16 bit programmable counter, which can be programmable by a power of 2, can be used. The 16 bit programmable counter can be configured such that it counts at least 8 bits, thereby enabling a lock to be detected with an accuracy of less than 1%.

With continued reference to FIG. 7, the detector timer 208 can use a detector clock for timing when the comparator output is asserted. The detector clock can be generated using a clock divider 210. The clock divider 210 can be programmed to generate, using the reference signal as an input, the detector clock having the same frequency as the reference signal or any subdivision of the frequency of the reference signal. In some instances, a 6-bit counter can be used to implement the clock divider 210. In other instances, the clock divider 210 could be an 8-bit counter programmable by a power of 2.

The lock detect 119 can work in an open loop, since the delayed divider input DIV PULSE can have a constant frequency. As a result, when the divider signal is not locked with the reference signal, the reference counter 202 and the divider counter 204 can have different count values. This can properly prevent a lock from being detected.

Yet in a closed loop, VCO output frequency can dynamically change as a loop filer output of an analog PLL changes. This can result in the divider output sometimes being faster or slower than the reference signal. Such a result can have an undesirable impact on the reliability of detecting a lock.

Using the reference multiplier described in connection with FIGS. 4 and/or 5, the problems associated with dynamically changing VCO output frequency can be overcome. For example, when the reference multiplier multiplies the frequency of a reference clock based on an output of the VCO in the PLL, such as the output of the VCO 110 of FIG. 2B, a window location can be dynamically changed such that phase lock can be ensured. The multiplied reference lock can be used to create a delay that can correspond to the dynamically changing frequency of VCO in an analog PLL. For instance, the multiplied reference clock can add a deterministic delay of one or more cycles of the multiplied reference clock to the reference signal and the divider signal using digital logic outside the feedback loop of the PLL. Accordingly, issues related to dynamic changes in VCO output frequency by combining a reference multiplier (for example, the reference multiplier 118a and/or 118b) and the lock detect 119.

Figure 9:
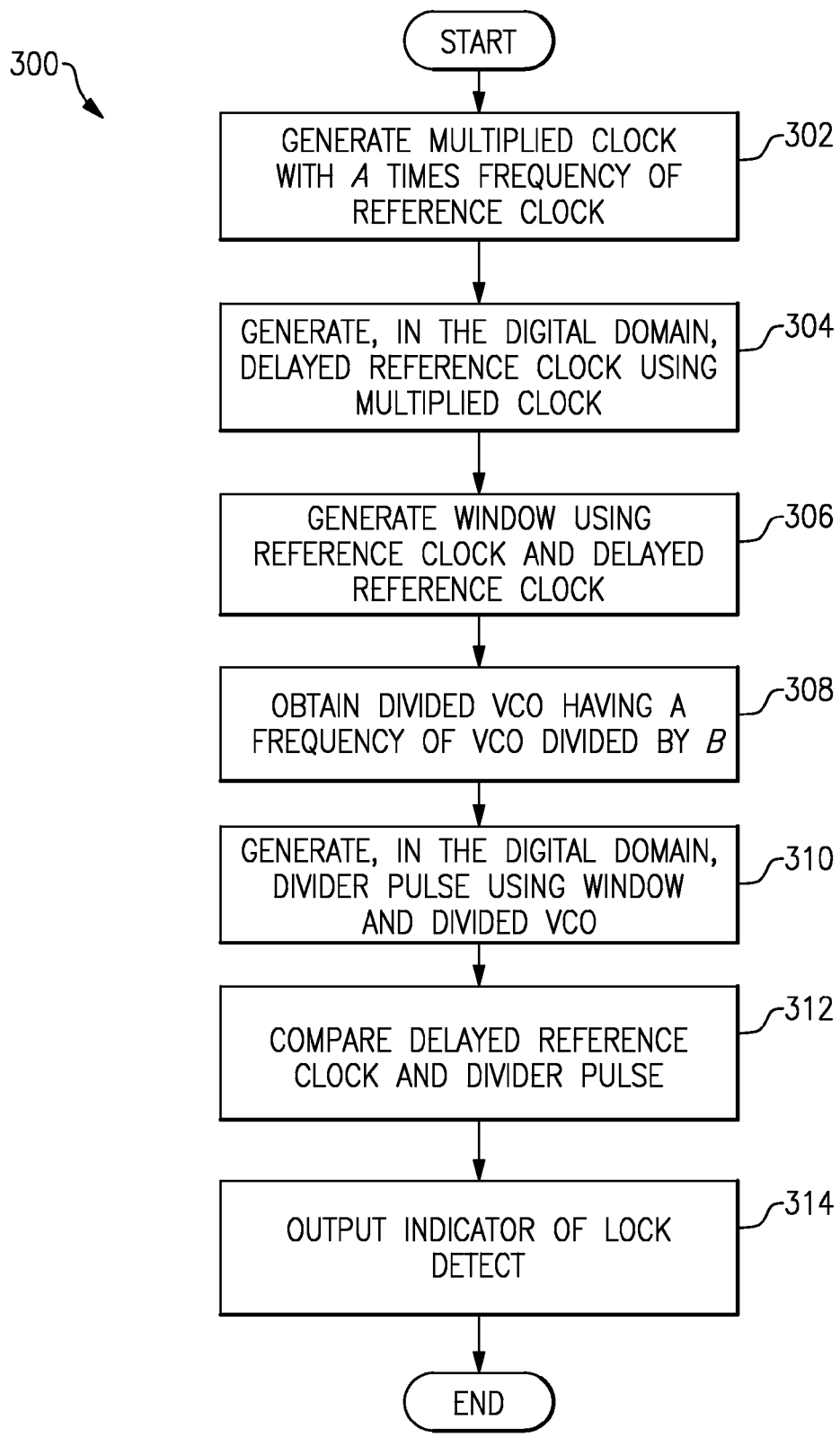
FIG. 9 is a flowchart of another example method of determining a lock detect according to another embodiment

FIG. 9 is a flowchart of an example method 300 of determining a lock detect, according to another embodiment. The method 300 can detect a lock of a PLL using any combination of features of the reference multipliers described in conjunction with any combination of the lock detectors described herein. As a result, a reliable lock can be detected that is independent of process, temperature, and/or dynamic changes in an analog PLL.

A multiplied clock with A times the frequency of a reference clock can be generated at block 302, where A can be an integer that is 2 or greater. A delayed reference clock can be generated in the digital domain using the reference clock at block 304. A window can also be generated using the reference clock and the delayed reference clock at block 306. Based on when the window is asserted, a delayed reference clock and a delayed divider clock can be compared. A divided VCO having a frequency of VCO divided by B can be obtained at block 308, where B can be a value greater than 1. The divided VCO signal can be generated from a VCO output by a divider that is outside the feedback path of the PLL. Alternatively, the divided VCO signal can be generated in the feedback path of the PLL and provided to a phase frequency detector. At block 310, a divider pulse can be generated in the digital domain using the window and the divided VCO.

The delayed reference clock and the divider pulse can be compared at block 312. The comparison may include comparing an output of separate counters for each of these signals to determine if the same number of transitions occur within a predetermined period of time. Then a determination of whether the PLL is locked can be determined. At block 314, an indicator of lock detect can be output. This indicator can be used to begin additional processing based on the PLL being locked.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the inventions to the precise form disclosed above. While specific embodiments of, and examples for, the inventions are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A lock detect assembly comprising:
a reference multiplier configured to receive a reference signal, a divider signal, and a voltage-controlled oscillator (VCO) output; generate a multiplied reference signal based on the reference signal and the VCO output, the multiplied reference signal having a frequency that is an integer multiple of a frequency of the reference signal, the integer having a value of at least 2; generate, using digital logic, a delayed reference signal; and generate, using digital logic, a delayed divider signal; and a lock detect in communication with the reference multiplier, the lock detect configured to detect a phase lock of the reference signal and the divider signal based at least in part on comparing a signal generated from a delayed reference signal and a signal generated from a delayed divider signal for a predetermined period of time, the delayed reference signal and the delayed divider signal generated, using digital logic, based on the multiplied reference signal.

2. The assembly of claim 1 wherein the reference multiplier is configured to generate the multiplied reference signal using at least two programmable counters including a first programmable counter configured to count a rising edge of the reference signal, and a second programmable counter configured to count a falling edge of the reference signal.

3. The assembly of claim 1 wherein the VCO output is generated by a VCO in a phase-locked loop (PLL) from which the divider signal is generated.

4. The assembly of claim 3 wherein the delayed reference signal is based on the divider signal and the multiplied reference signal.

5. The assembly of claim 4 wherein the delayed divider signal is based on the divider signal and the multiplied reference signal.

6. The assembly of claim 3 wherein the reference multiplier is further configured to generate, using digital logic, a window signal based at least in part on the delayed reference signal and the reference signal.

7. The assembly of claim 6 wherein the reference multiplier is further configured to generate a divider pulse based on the delayed divider signal and the window signal.

8. The assembly of claim 7 wherein the lock detect is configured to detect the lock based on a comparison of the divider pulse and the delayed reference signal.

9. The assembly of claim 8 wherein the lock detect is configured to detect the phase lock based on comparing a count of edge of the delayed reference signal and a count of edges of the divider pulse.

10. The assembly of claim 9 wherein the lock detect is configured to detect the phase lock based on a result of the comparison indicating that the reference signal and the divider signal are locked for a predetermined period of time.

11. The assembly of claim 1 wherein each of the recited functionalities of the lock detect assembly are implemented using circuits from a digital circuit library.

12. An electronic system for detecting a phase lock, the system comprising:
a phase-locked loop (PLL) configured to lock a phase of a reference signal and a feedback signal provided to a phase detector of the PLL, the PLL including a variable frequency oscillator;
a reference multiplier configured to receive a reference signal and a variable frequency oscillator output, and generate a multiplied reference signal based at least in part on the reference signal and the variable frequency oscillator output, the multiplied reference signal having a frequency that is an integer multiple of a frequency of the reference signal, the integer having a value of at least 2; and
a lock detect in communication with the reference multiplier, the lock detect configured to detect a phase lock of the reference signal and the feedback signal based at least in part on comparing a signal generated from a delayed reference signal and a signal generated from a delayed feedback signal for a predetermined period of time, the delayed reference signal and the delayed feedback signal generated with digital logic based at least in part on the multiplied reference signal.

13. The system of claim 12 wherein the variable frequency oscillator output is generated by the variable frequency oscillator of the PLL.

14. The system of claim 12 wherein the phase-locked loop, the reference multiplier, and the lock detect are embodied on a single integrated circuit.

15. The system of claim 12 further comprising a processor configured to start generating data in response to an indicator of lock detect generated by the lock detect.

16. A method of detecting a lock of a phase-locked loop, the method comprising:
generating a delayed reference signal based on a reference signal provided to the phase-locked loop and a VCO output having a frequency that depends on a phase-locked loop output frequency;
generating a delayed divider signal based on a divider signal generated from an output of a VCO in the phase-locked loop and the VCO output;
counting edges of the delayed reference signal using a first counter implemented in digital logic;
counting edges of the delayed divider signal using a second counter implemented in digital logic; and
detecting whether a phase of the reference signal and a phase of the divider signal are locked based at least in part on comparing the count of the edges of the delayed reference signal and the count of the edges of the delayed divider signal for a predetermined period of time.

17. The method of claim 16 wherein the first counter is a programmable counter configurable to adjust an accuracy of determining whether the phase of the reference signal and the phase of the divider signal are locked.

18. The method of claim 16 wherein determining whether the phase of the reference signal and the phase of the divider signal are locked is computed to within 1% accuracy.

19. The method of claim 16 wherein comparing the count of the edges of the delayed reference signal and the count of the edges of the delayed divider signal further includes counting edges of an output of a comparator.

20. The method of claim 19 wherein counting edges of the output of a comparator is based on a divided reference signal generated by a divider circuit configured to reduce the frequency of the reference signal.

21. The method of claim 20 wherein the predetermined period of time can be adjusted by changing the frequency of the divided reference signal via the divider circuit.

22. The method of claim 16 further comprising generating a window signal based on the reference signal and the delayed reference signal, the window signal providing a timeframe during which the delayed divider signal can be asserted.

* * * * *